United States Patent
Shim et al.

(10) Patent No.: US 8,810,279 B2
(45) Date of Patent: Aug. 19, 2014

(54) PSEUDO-STATIC DOMINO LOGIC CIRCUIT AND APPARATUSES INCLUDING SAME

(71) Applicants: Ken Keon Shim, Seongnam-Si (KR); Hoi Jin Lee, Seoul (KR); Gun Ok Jung, Yongin-Si (KR)

(72) Inventors: Ken Keon Shim, Seongnam-Si (KR); Hoi Jin Lee, Seoul (KR); Gun Ok Jung, Yongin-Si (KR)

(73) Assignee: Samsung Electronics Co., Ltd., Suwon, Gyeonggi-do (KR)

( * ) Notice: Subject to any disclaimer, the term of this patent is extended or adjusted under 35 U.S.C. 154(b) by 46 days.

(21) Appl. No.: 13/729,125

(22) Filed: Dec. 28, 2012

(65) Prior Publication Data

US 2013/0246834 A1    Sep. 19, 2013

(30) Foreign Application Priority Data

Mar. 19, 2012 (KR) .......................... 10-2012-0027741

(51) Int. Cl.
*H03K 19/00* (2006.01)

(52) U.S. Cl.
USPC ................................. 326/93; 326/96; 326/97

(58) Field of Classification Search
USPC ...................................................... 326/93–98
See application file for complete search history.

(56) References Cited

U.S. PATENT DOCUMENTS

| | | | |
|---|---|---|---|
| 5,504,441 A * | 4/1996 | Sigal | 326/93 |
| 5,541,536 A | 7/1996 | Rajivan | |
| 5,983,013 A * | 11/1999 | Rogers et al. | 702/79 |
| 6,316,960 B2 | 11/2001 | Ye | |
| 6,407,585 B1 | 6/2002 | Vinh | |
| 6,549,038 B1 | 4/2003 | Sechen et al. | |
| 6,781,472 B2 | 8/2004 | Watanabe | |
| 7,932,750 B2 | 4/2011 | Kim | |

FOREIGN PATENT DOCUMENTS

| | | |
|---|---|---|
| JP | 2001244806 A | 9/2001 |
| KR | 1020000069742 A | 11/2000 |
| KR | 100303921 B1 | 7/2001 |
| KR | 20010059289 A | 7/2001 |
| KR | 20100134937 A | 12/2010 |

* cited by examiner

*Primary Examiner* — Anh Tran
(74) *Attorney, Agent, or Firm* — Volentine & Whitt, PLLC

(57) ABSTRACT

A domino logic circuit includes a plurality of domino logic stages connected in series between a latch and a flip-flop and a clock signal generator generating a clock signal having a first duty cycle and a flip-flop clock signal having a second duty cycle. The latch and the domino logic stages respectively operate in response to a domino clock signals derived from the first clock signal. The flip-flop operates in response to the flip-flop clock signal.

20 Claims, 8 Drawing Sheets

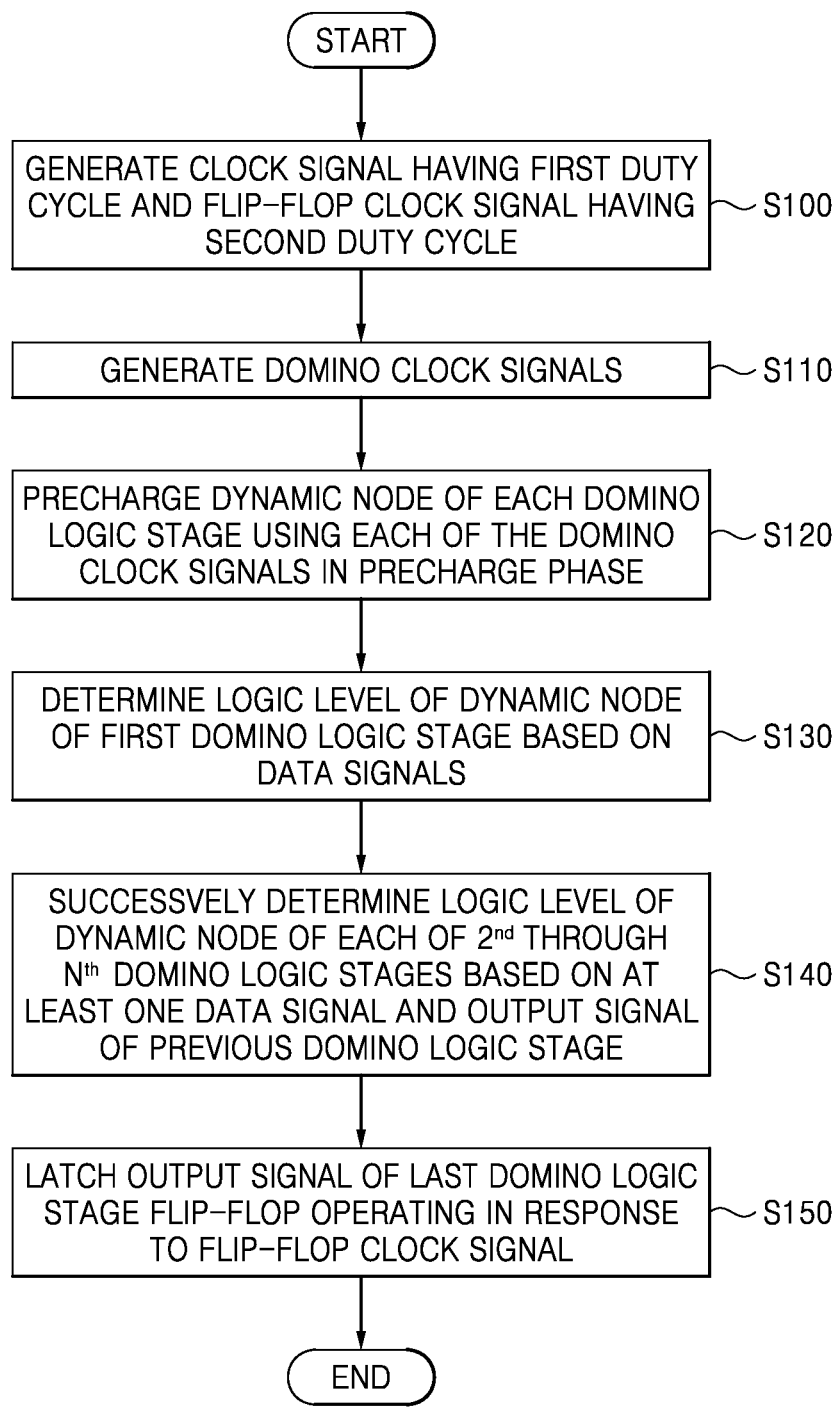

PSEUDO-STATIC DOMINO LOGIC CIRCUIT AND APPARATUSES INCLUDING SAME

CROSS-REFERENCE TO RELATED APPLICATIONS

This application claims priority under 35 U.S.C. §119(a) from Korean Patent Application No. 10-2012-0027741 filed on Mar. 19, 2012, the subject matter of which is hereby incorporated by reference.

BACKGROUND

Embodiments of the inventive concept relate to domino logic circuits, and more particularly, to pseudo-static NP domino logic circuits capable of more accurately processing data with increased processing speed. Embodiments of the inventive concept also relate to apparatuses including this type of domino logic circuit.

Domino logic circuits are well known in the field of digital logic circuitry. It is not uncommon for a domino logic circuit to be used in the critical path of a processor or similar computational logic circuit where low data latency is an important design factor. The design of digital logic systems and data processing systems is usually a matter of trade-offs between computational speed, computational accuracy, physical size, power consumption, etc. Indeed, the use of domino logic circuit(s) in many contemporary systems is motivated by the relative ability of such circuits to provide acceptable performance with relatively reduced size and power consumption.

However, domino logic circuits are not without their design, implementation and operation problems. For example, the "pulsed" nature of domino logic circuit signals leads to well understood problems associated with input pulse overlap and domino gate output hold timing at clock cycle boundaries. Multiple conventional attempts to address these problems have resulted in undesirably large domino logic circuits and/or undue power consumption. Where multiple phase, over-lapping clock signals are used to address the noted problems, circuit complexity rises along with circuit size and power consumption. Other conventional attempts to convert early phase domino pulses into static signal using a so-called "staticizing" latches in order to avoid hold timing issues only results in signal processing delays as well as power and size problems.

Nonetheless, as the operating speed of contemporary processors and digital logic circuits increases, the demand for faster, smaller, and better-performing domino logic circuits continues.

SUMMARY

According to certain embodiments of the inventive concept, there is provided a domino logic circuit comprising; a plurality of domino logic stages connected in series between a latch and a flip-flop, and a clock signal generator that generates a clock signal having a first duty cycle and a flip-flop clock signal having a second duty cycle different from the first duty cycle, wherein the latch and each one of the plurality of domino logic stages respectively operates in response to one of a plurality of domino clock signals related to the clock signal, and the flip-flop operates in response to the flip-flop clock signal.

According to certain embodiments of the inventive concept, there is provided a central processing unit (CPU) comprising; an arithmetic logic unit (ALU) and a control unit that controls operation of the ALU, the ALU comprising; a plurality of domino logic stages connected in series between a latch and a flip-flop, and a clock signal generator that generates a clock signal having a first duty cycle and a flip-flop clock signal having a second duty cycle different from the first duty cycle, wherein the latch and each one of the plurality of domino logic stages respectively operates in response to one of a plurality of domino clock signals related to the clock signal and the flip-flop operates in response to the flip-flop clock signal.

According to certain embodiments of the inventive concept, there is provided a data processing apparatus comprising; a memory and a central processing unit (CPU) that controls operation of the memory, wherein the CPU includes an arithmetic logic unit (ALU) and a control unit that controls operation of the ALU, the ALU comprising; a plurality of domino logic stages connected in series between a latch and a flip-flop, a clock signal generator that generates a clock signal having a first duty cycle and a flip-flop clock signal having a second duty cycle different from the first duty cycle, wherein the latch and each one of the plurality of domino logic stages respectively operates in response to one of a plurality of domino clock signals related to the clock signal and the flip-flop operates in response to the flip-flop clock signal.

According to certain embodiments of the inventive concept, there is provided a method of operating an integrated circuit including a plurality of domino logic stages connected in series between a latch and a flip-flop, the method comprising; generating a clock signal having a first duty cycle and a flip-flop clock signal having a second duty cycle different from the first duty cycle, generating a plurality of domino clock signals by passing the clock signal through an inverter chain that at each stage of the inverter chain provides either the clock signal or an inverted clock signal, pre-charging each one of the plurality of domino logic stages in response to a corresponding one of the plurality of domino clock signals, determining a logic level of a first domino logic stage among the plurality of domino logic stages in response to an output signal provide by the latch and a data signal applied to the first domino logic stage, successively and respectively determining a logic level of a second through Nth domino logic stage among the plurality of domino logic stages in response to an output signal provide by a previous domino logic stage and a data signal respectively applied to the second through Nth domino logic stages, and latching a data signal of a last one of the plurality of domino logic stages in a flip-flop in response to the flip-flop clock signal.

BRIEF DESCRIPTION OF THE DRAWINGS

The above and other features and advantages of the inventive concept will become more apparent upon consideration of certain exemplary embodiments with reference to the attached drawings in which:

FIG. 8 is a flowchart summarizing one possible operating method for the pipelined domino logic circuit of FIG. 1.

DETAILED DESCRIPTION

The inventive concept now will be described in some additional detail with reference to the accompanying drawings. This inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. Throughout the written description and drawings, like reference numbers and labels are used to denote like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
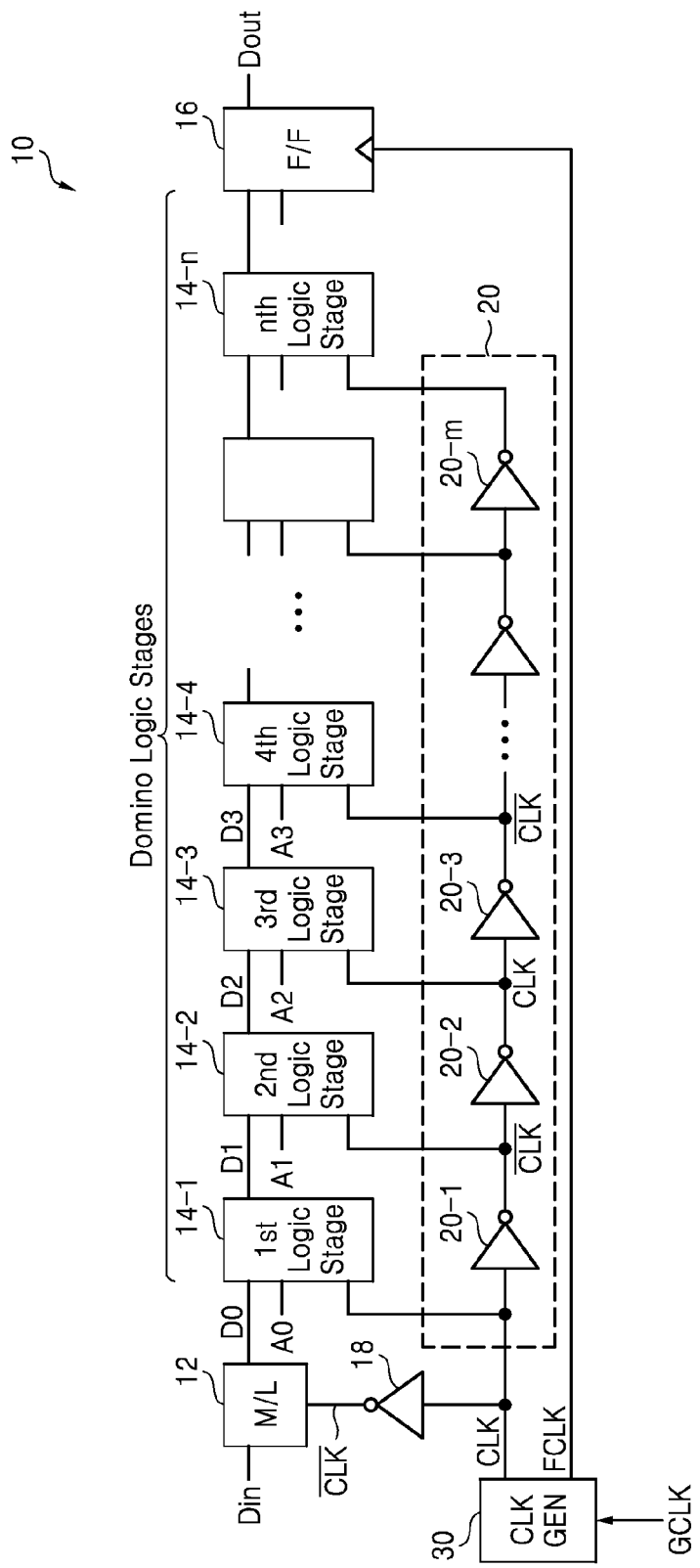
FIG. 1 is a block diagram of a pipelined domino logic circuit including a domino logic circuit according to embodiments of the inventive concept.

Figure (FIG.) 1 is a block diagram of a pipelined domino logic circuit 10 including a domino logic circuit according to certain embodiments of the inventive concept. Referring to FIG. 1, the pipelined domino logic circuit 10 comprises a plurality of domino logic stages (14-1 through 14-n) series-connected between a latch 12 and a flip-flop 16. The pipelined domino logic circuit 10 further comprises; a clock signal generator 30, an inverter 18, and an inverter chain 20 including a plurality of series-connected inverters (20-1 through 20-m). Within this configuration, the latch 12 serves as a master latch.

The pipelined domino logic circuit 10 and other embodiments of the inventive concept may be considered simply as a domino logic circuit, or as a cascaded domino logic circuit, or more particularly as a pseudo-static domino logic circuit.

Within the circuit configuration of FIG. 1, the latch 12 may be used latch (i.e., receive and temporarily store) input data (Din) in response to an inverted clock signal provided through the inverter 18. The clock signal generator 30 may be used to generate a clock signal (CLK) having a first duty cycle and a flip-flop clock signal (FCLK) having a second duty cycle in response to an externally provided global clock signal (GCLK).

The latch 12, as well as each one of the cascaded plurality of domino logic stages 14-1 through 14-n, respectively operate in response to one of "the clock signal" (CLK) or the "inverted clock signal" (CLK bar), an inverted version of the generated clock signal. Thus, in the illustrated embodiment of FIG. 1, the clock signal passes through the inverter chain 20 and at each stage of the inverter chain 20 provides either the clock signal, or its logical complement, the inverted clock signal as respective "domino logic stage clock signals". In this regard, the logic stage-by-logic stage application of either a clock signal level or an inverted clock signal level, also assumes a relative delay of the clock signal on a logic stage-by-logic stage basis. Hence, the clock signal applied to the first logic stage 14-1 will have the same logical level as the clock signal applied to the third logic stage 14-2, but at any given time the clock signal applied to the third logic stage 14-3 will be relatively delayed in relation to the clock signal applied to the first logic stage 14-1.

The flip-flop 16 operates in response to the flip-flop clock signal FCLK.

Figure 2:
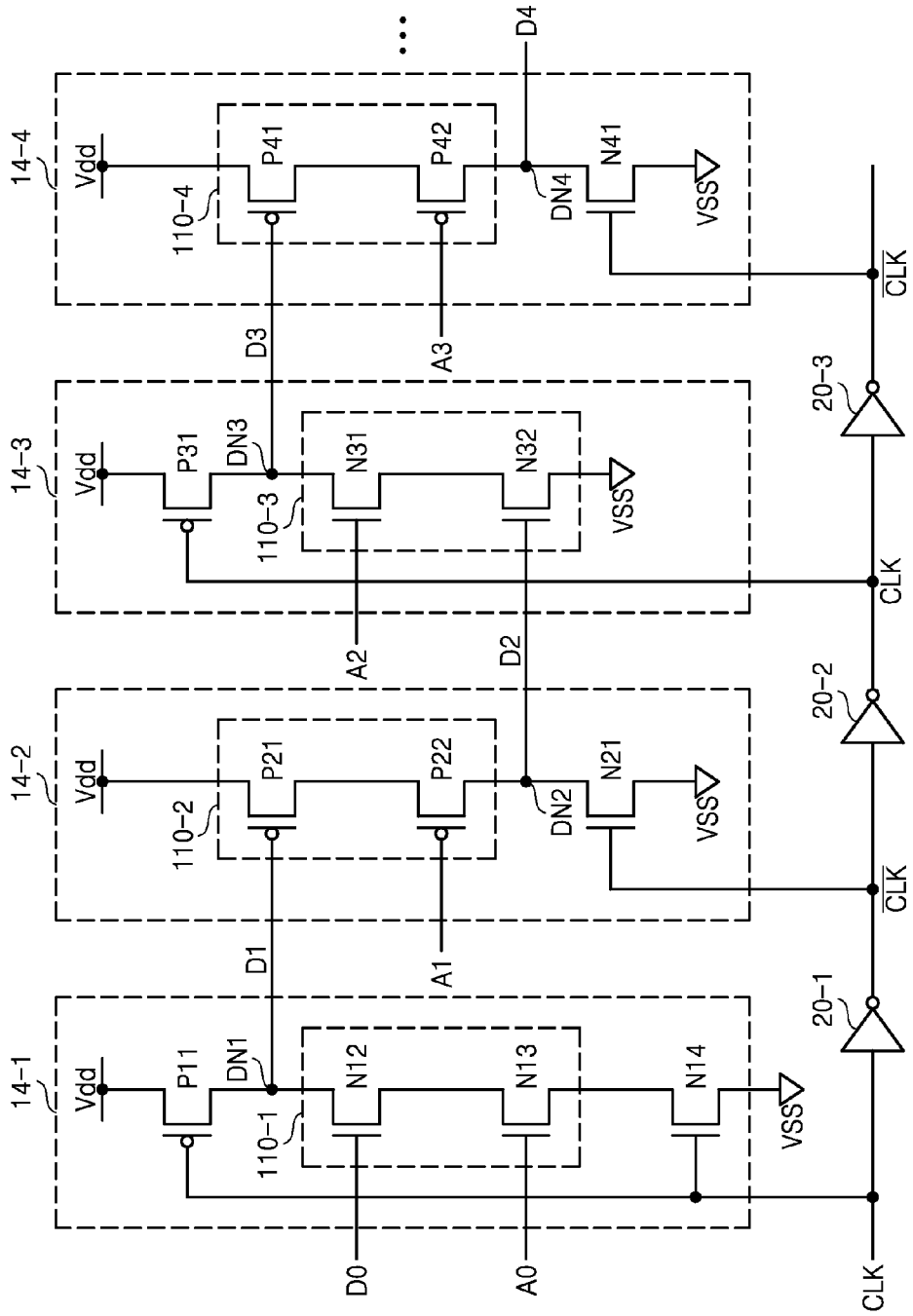
FIG. 2 is a circuit diagram further illustrating a portion of the pipelined domino logic circuit of FIG. 1.

FIG. 2 is a circuit diagram further illustrating a portion of the pipelined domino logic circuit 10 of FIG. 1. That is, FIG. 2 will be used to further describe the operation of the domino logic stages 14-1 through 14-4 in response to the applied clock signal and inverted clock signal. In the description that follows, it will be assumed that a first value or first phase of the clock signal is a logically "low", while a second value or second phases of the clock signal is a logically "high". However, those skilled in the art will recognize that definitions of "high" and "low" as well as "first" and "second" are completely arbitrary and drawn in relation to certain assumed logic states for the exemplary circuit elements (e.g., P-type and N-type transistors) in the accompanying drawings. Other embodiments of the inventive concept may readily "reverse" these arbitrary high/low clock signal designations in view of other circuit element arrangements.

When the clock signal is low, the latch 12 will latch received input data in response to the inverted clock signal provided by the inverter 18, and each of the plurality of domino logic stages 14-1 through 14-n in the pipelined domino logic circuit 10 operates in a pre-charge phase (i.e., performs a pre-charge operation). In other words, when the clock signal is low, metal oxide semiconductor (MOS) transistors P11, N21, P31, and N41 are turned ON and an N-channel MOS (NMOS) transistor N14 is turned OFF.

The threshold voltage of the MOS transistors P11 and P31 may be designed to be less than that of MOS transistors P21, P22, P41, and P42, respectively. The threshold voltage of the MOS transistors N21 and N41 may be designed to be less than that of MOS transistors N12, N13, N31, and N32, respectively. For instance, the difference between the threshold voltage of the MOS transistor P11 and the threshold voltage of the MOS transistor P21 may be about 100 mV.

Referring to FIGS. 1 and 2, the first domino logic stage 14-1 comprises a pre-charge circuit P11, a logic network 110-1, and an evaluation transistor N14.

The MOS transistors P11 and N14 will operate in a complementary manner to prevent a short-circuit current from flowing between "a first node" disposed between a first power supply voltage (e.g., Vdd) and a second power supply voltage (e.g., ground or VSS).

The pre-charge circuit P11 of the first domino logic stage 14-1 will pre-charge a first dynamic node DN1 to a pre-charge voltage in response to the low clock signal. The pre-charge voltage may be defined as Vdd or Vdd less the threshold voltage (Vth) of the PMOS transistor P11.

The second domino logic stage 14-2 includes a logic network 110-2 and a discharge circuit N21. The discharge circuit N21 of the second domino logic stage 14-2 discharges a second dynamic node DN2 to the ground voltage VSS in response to a high inverted clock signal, as provide by the first inverter 20-1.

The third domino logic stage 14-3 includes a logic network 110-3 and a pre-charge circuit P31. The pre-charge circuit P31 of the third domino logic stage 14-3 pre-charges a third dynamic node DN3 to the pre-charge voltage in response to the low clock signal, as provided by the second inverter 20-2.

The fourth domino logic stage 14-4 includes a logic network 110-4 and a discharge circuit N41. The discharge circuit N41 of the fourth domino logic stage 14-4 discharges a fourth dynamic node DN4 to the ground voltage VSS in response to the high clock signal, as provide by the third inverter 20-3.

Thus, within this configuration when the clock signal CLK is low, the dynamic nodes of the respective domino logic stages 14-1 through 14-n will be successively (i.e., one-at-a-time) pre-charged to a predetermined pre-charge voltage or discharged to ground.

The operation of the plurality of domino logic stages 14-1 through 14-n when the clock signal is high will be described below. When the clock signal is high, the plurality of domino logic stages 14-1 through 14-n in the pipelined domino logic circuit 10 operates in an evaluation phase (or perform an evaluation operation).

Although two (2) input AND gates are shown in the illustrated example of FIG. 2 for the respective logic networks 110-1 through 110-4, those skilled in the art will understand that other logical gate types (or combination of logic gates) with other input signal arrangements might alternately be used in other embodiments of the inventive concept. For example two or more MOS transistors might be connected in series, in parallel, or some combination of series and parallel between a corresponding dynamic node and one or more power supply node(s).

For example, the logic network included in any one or all of the plurality of domino logic stages 14-1 through 14-n may be implemented using a NAND gate, a NOR gate, an AND-OR-Invert (AOI) gate, an OR-AND-Invert (OAI) gate, etc., wherein at least two (2) input terminals of the various gate configurations will respectively receive a data signal.

Returning to the illustrated example of FIG. 2, when the clock signal is high, the MOS transistors P11, N21, P31, and N41 are turned OFF.

The logic network 110-1 of the first domino logic stage 14-1 determines a logic level of the first dynamic node DN1 in response to the high clock signal, an output signal D0 provided by the latch 12, and a data signal A0. In the illustrated example, when the output signal D0 and the data signal A0 are both high, the logic level of the first dynamic node DN1 will transition from high to low. In all other input cases for the output signal D0 and the data signal A0, the logic level of the first dynamic node DN1 will remain high.

Once the logic level at the first dynamic node DN1 is determined, the logic level of the second dynamic node DN2 of the logic network 110-2 may be determined. In this manner, the determination of a logic state for each successive "current" domino logic stage may be had, wherein the determination of the logic state for the current domino logic stage (after the first domino logic stage) will be had using, as an applied input signal to the current domino logic stage, an output signal from a "previous" (i.e., immediately preceding) domino logic stage in the plurality of domino logic stages 14-1 through 14-n.

Accordingly, the logic network 110-2 of the second domino logic stage 14-2 (as a current domino logic stage) determines a logic level of the second dynamic node DN2 in response to the output signal D1 provided by the first dynamic node DN1 of the previous domino logic stage (first domino logic stage 14-1) and a data signal A1 applied to the current domino logic stage.

In similar manner and in its turn within the cascade of series-connected domino logic stages 14-1 through 14-n, the logic network 110-3 of the third domino logic stage 14-3 determines a logic level of the third dynamic node DN3 in response to an output signal D2 provided in turn by the second dynamic node DN2 of the previous domino logic stage 14-2 and a data signal A2 applied to the current domino logic stage.

In similar manner and in its turn within the cascade of series-connected domino logic stages 14-1 through 14-n, the logic network 110-4 of the fourth domino logic stage 14-4 determines a logic level of the fourth dynamic node DN4 in response to the output signal D3 of the third dynamic node DN3 of a previous domino logic stage 14-3 and a data signal A3 applied to the current domino stage.

Thus, the logic level of each dynamic node in each of the plurality of domino logic stages 14-2 through 14-n will be successively determined based on an output signal provide by a previous domino logic stage and at least one data signal applied to the current domino logic stage.

In the foregoing example, it is assumed that the structure of each "odd-numbered domino logic stage" among the plurality of domino logic stages 14-1 through 14-n except for the first domino logic stage 14-1 is the same. Therefore, each of the odd-number domino logic stages 14-1, 14-3, . . . may be implemented as an N-domino stage. Further, it is assumed that the structure of each "even-numbered domino logic stages" 14-2, 14-4, . . . among the plurality of domino logic stages 14-1 through 14-n is the same. Therefore, each of the even-number domino logic stages 14-2, 14-4, . . . may be implemented as a P-domino stage.

Figure 3:
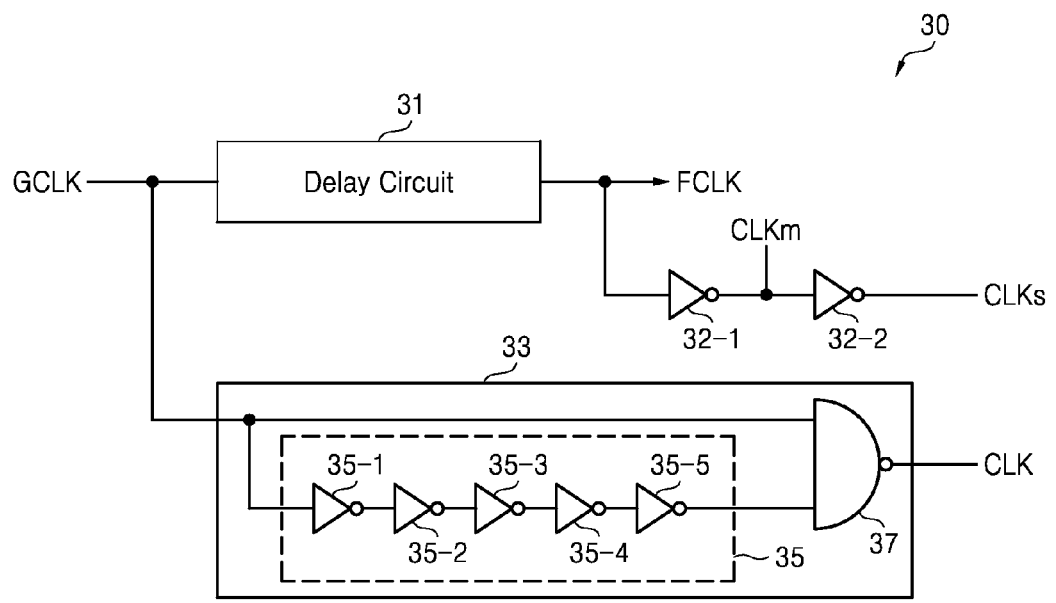
FIG. 3 is a circuit diagram further illustrating the clock signal generator of FIG. 1.
Figure 4:
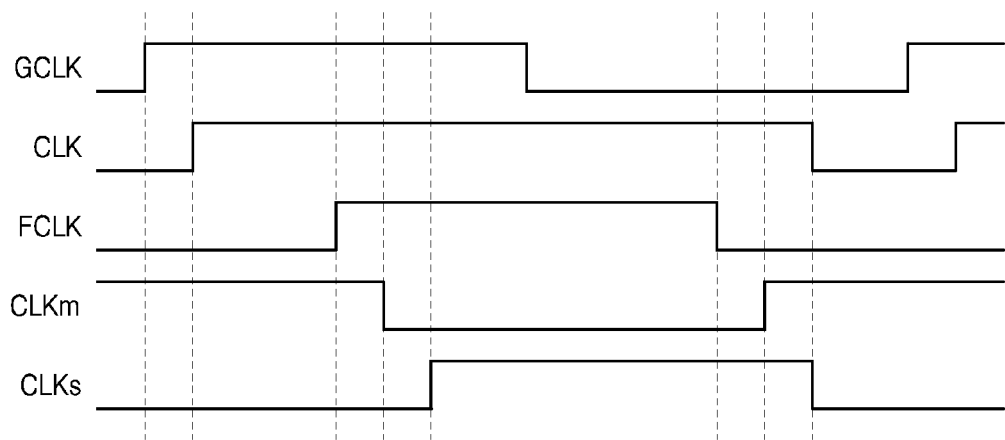
FIG. 4 is a related timing chart illustrating certain clock signals generated by the clock signal generator of FIGS. 1 and 3.

FIG. 3 is a circuit diagram further illustrating in one embodiment the clock signal generator 30 of FIG. 1, and FIG. 4 is a related timing diagram for certain clock signals generated by the clock signal generator 30. Referring collectively to FIGS. 1, 3, and 4, the clock signal generator 30 comprises a delay circuit 31 and a clock signal generating logic circuit 33. The delay circuit 31 generates the flip-flop clock signal (FCLK) by delaying the global clock signal (GCLK).

The clock signal generating logic circuit 33 generating the clock signal CLK includes an inverter chain 35 and a NAND gate 37. The inverter chain 35 includes multiple series-connected inverters 35-1 through 35-5. The global clock signal is applied to the inverter chain 35. The NAND gate 37 generates the clock signal by performing an NAND operation on the global clock signal and the output of the inverter chain 35.

However, this is just one example of a range of logic element arrangements that may be used to appropriately generate the clock signal.

According to one result of the foregoing, the duty cycle of the clock signal will be greater than the duty cycle of the flip-flop clock signal. For instance, a ratio of the flip-flop clock signal duty cycle to the clock signal duty cycle may range from between greater than 0.5 and less than 1.0 for certain embodiments of the inventive concept. One way to facilitate the desired duty cycle ratio is further illustrated in FIG. 4, wherein the clock signal is shown "activated" (e.g., transitions from low to high) before, and is "deactivated" (e.g., transitions from high to low) after the flip-flop clock signal.

The clock signal generator 30 may further comprise a first inverter 32-1 inverting the flip-flop clock signal and a second inverter 32-2 inverting the output of the first inverter 32-1. In certain embodiments, a first latching clock signal (CLKm) may be obtained from the output of the first inverter 32-1 and provided to a master latch (not shown) in the pipelined domino logic circuit 10, and a second latching clock signal (CLKs) may be obtained from the output of the second inverter 32-2 and provided to a slave latch (not shown) in the pipelined domino logic circuit 10.

Figure 5:
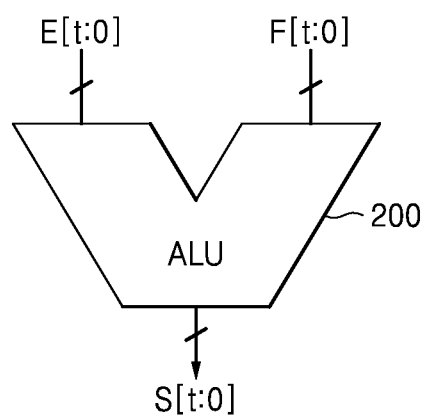
FIG. 5 is a general block diagram of an arithmetic logic unit (ALU) incorporating a pipelined domino logic circuit like the one described in relation to FIG. 1.
Figure 6:
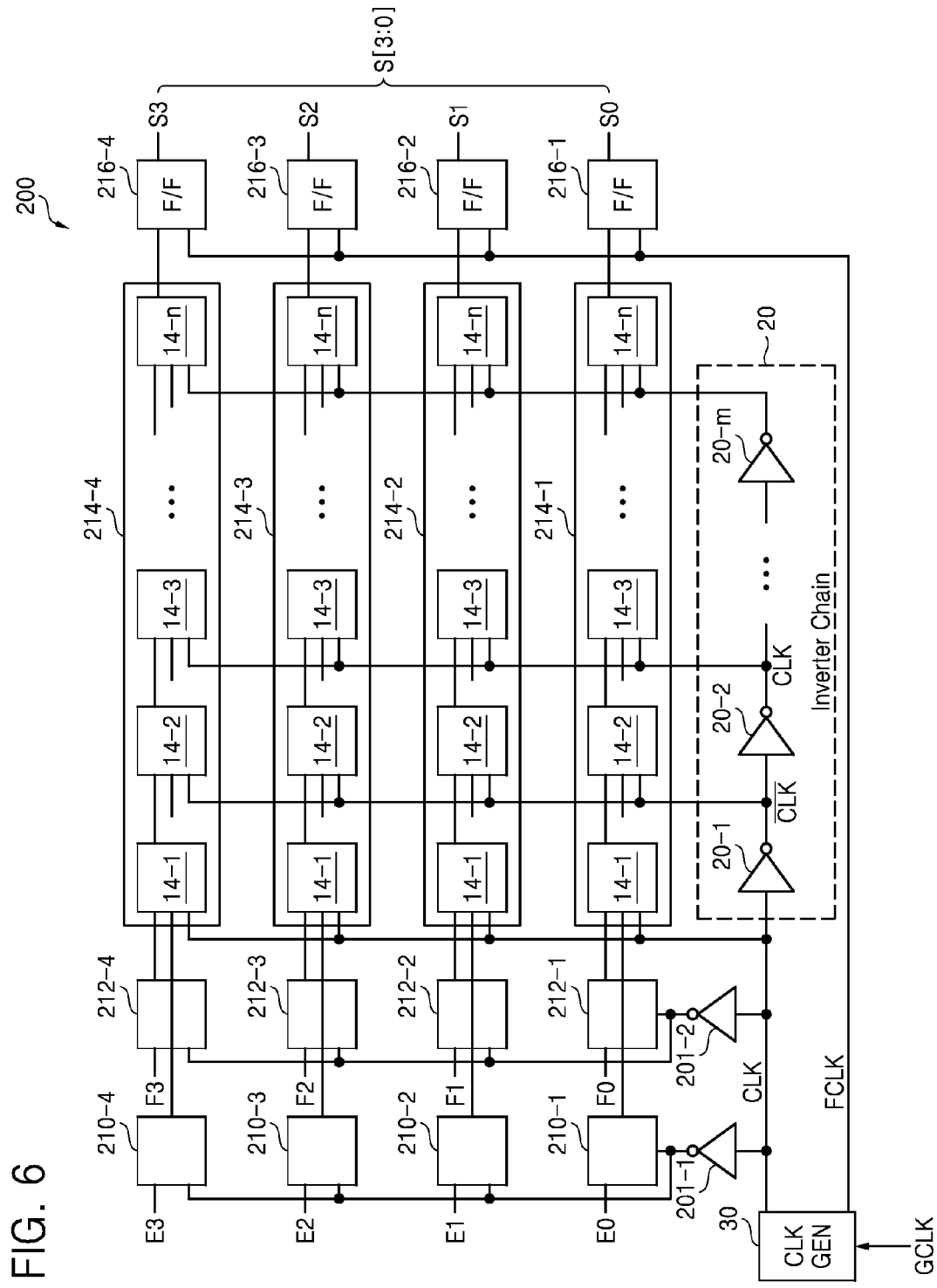
FIG. 6 is a block diagram of a 4-bit adder incorporating a pipelined domino logic circuit like the one described in relation to FIG. 1.

FIG. 5 is a general block diagram of an arithmetic logic unit (ALU) 200 incorporating a pipelined domino logic circuit like the one described in relation to FIG. 1. FIG. 6 is a block diagram of a 4-bit adder 200 incorporating a pipelined domino logic circuit like the one described in relation to FIG. 1. These exemplary apparatus embodiments of the inventive concept will be described hereafter under an assumption that the ALU 200 illustrated in FIG. 5 is a 4-bit ALU (i.e., a 4-bit adder) like the one illustrated in FIG. 6.

Referring to FIGS. 5 and 6, the ALU 200 may be sued to add first data signals E[3:0] and second data signals F[3:0] in order to output third data signals S[3:0].

First master latches 210-1 through 210-4 latch bits E0, E1, E2, and E3, respectively, in response to the inverted clock signal as provide by an inverter 201-1. Second master latches 212-1 through 212-4 latch bits F0, F1, F2, and F3, respectively, in response to the inverted clock signal as provide by an inverter 201-2.

Each of stage blocks 214-1 through 214-4 includes a plurality of domino logic stages 14-1 through 14-n. Each of flip-flops 216-1 through 216-4 latches an output signal of a last domino logic stage 14-n of each stage block 214-1, 214-2, 214-3, and 214-4 in response to the flip-flop clock signal.

During the evaluation phase, a logic network of the first domino logic stage 14-1 of the first stage block 214-1 determines the logic level of its own dynamic node in response to the data signals E0 and F0 as respectively output by the master latches 210-1 and 212-1, a logic network of the first domino logic stage 14-1 of the second stage block 214-2 determines the logic level of its own dynamic node in response to the data signals E1 and F1 as respectively output by the master latches 210-2 and 212-2, a logic network of the first domino logic stage 14-1 of the third stage block 214-3 determines the logic level of its own dynamic node in response to the data signals E2 and F2 as respectively output by the master latches 210-3 and 212-3, and a logic network of the first domino logic stage 14-1 of the fourth stage block 214-4 determines the logic level of its own dynamic node in response to the data signals E3 and F3 as respectively output by the master latches 210-4 and 212-4.

As will be appreciated from the former description, data signals are applied to the domino logic stages 14-2 through 14-n but are not shown in FIG. 6 for the sake of clarity. Such data signals may be provide from a data source of conventional design. Further, for the sake of clarity, the carry-in and carry-out of the illustrated circuits are omitted from FIG. 6, but will be understood by those skilled in the art.

Figure 7:
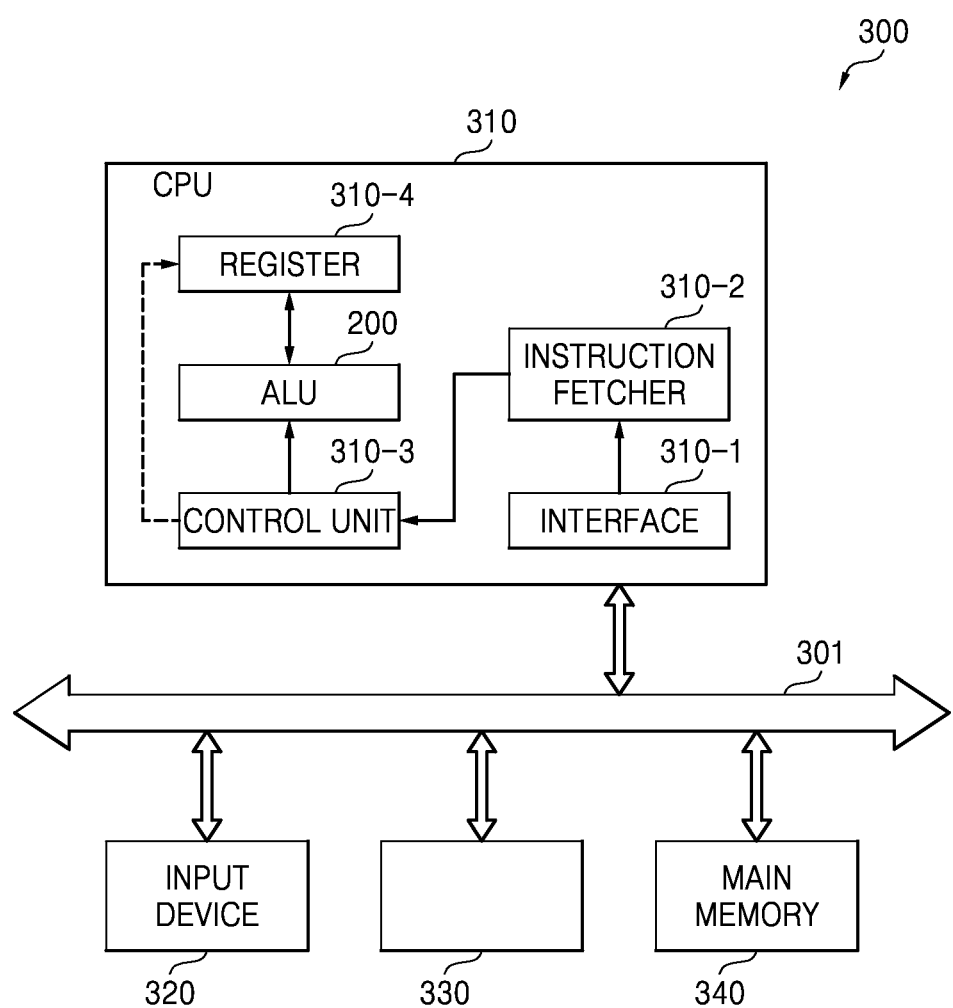
FIG. 7 is a block diagram of a data processing apparatus incorporating an ALU like the one described in relation to FIG. 5.

FIG. 7 is a block diagram of a data processing apparatus 300 incorporating an ALU like the one described in relation to FIG. 5. The data processing apparatus 300 generally comprises a central processing unit (CPU) 310 communicating data with and among an input device 320, a display 330, and a main memory 340 via a bus 301.

The data processing apparatus 300 may be implemented as a personal computer (PC), a data server, or a portable device. The portable device may be a laptop computer, a mobile telephone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, or an e-book.

The CPU 310 may control the input device 320, the display 330, and the main memory 340. The CPU 310 includes an interface 310-1, an instruction fetcher 310-2, a control unit 310-3, the ALU 200, and a register 310-4. An instruction fetched by the instruction fetcher 310-2 from the main memory 340 may be transmitted to the control unit 310-3 via the instruction fetcher 310-2.

The control unit 310-3 controls the ALU 200 according to an instruction output from the instruction fetcher 310-2. For instance, as described above with reference to FIGS. 5 and 6, when an add instruction indicates that the first data signals E[3:0] and the second data signals F[3:0] are added, the ALU 200 adds bitwise the first data signals E[3:0] and the second data signals F[3:0] output from the register 310-4. At this time, the control unit 310-3 may transmit an instruction instructing to output the first data signals E[3:0] and the second data signals F[3:0] to the register 310-4. The register 310-4 may be a storage or a register file. The addition result provide by the ALU 200 may be transmitted to the register 310-4.

The input device 320 receives control signals that control the operation of the CPU 310 or data to be processed by the CPU 310 to be input to the data processing apparatus 300. The input device 320 may be implemented by a pointing device such as a touch pad or a computer mouse, a keypad, or a keyboard.

The display 330 may display data processed by the CPU 310. The display 330 may be implemented by a thin film transistor-liquid crystal display (TFT-LCD), a light emitting diode (LED) display, an organic LED (OLED) display, or an active-matrix OLED (AMOLED) display. The main memory 340 may store data that will be or has been processed by the CPU 310. The main memory 340 may be implemented by a volatile or non-volatile memory.

FIG. 8 is a flowchart summarizing one possible operating method for the pipelined domino logic circuit 10 of FIG. 1. Referring to FIGS. 1 through 8, the clock signal generator 30 derives a clock signal having a first duty cycle and a flip-flop clock signal having a second duty cycle different from the first cycle from (e.g.) an applied global clock signal (S100).

The inverter chain 20 illustrated in FIG. 1 generates a plurality of domino clock signals (e.g., timed applications of the clock signal CLK and the inverted clock signal CLK bar) (S110).

During a pre-charge phase, the dynamic node of each of the domino logic stages 14-1 through 14-n is pre-charged to either a predetermined pre-charge voltage or discharged to ground voltage VSS in response to a corresponding one of the domino clock signals (S120).

During an evaluation phase, the first domino logic stage 14-1 determines the logic level of the dynamic node DN1 based on the input data signals D0 and A0 respectively input to the transistors N12 and N13, which are connected between the dynamic node DN1 and the ground VSS through the evaluation transistor N14 (S130).

Then, during the evaluation phase, the logic level of the dynamic node of each of the remaining ($2^{nd}$ through Nth) domino logic stages 14-2 through 14-$n$ is successively determined based on at least one data signal and an output signal of a previous domino logic stage which are respectively input to transistors directly connected between the dynamic node and the power supply node in a current domino logic stage (S140).

The flip-flop 16 latches an output signal of the last domino logic stage 14-$n$ in response to the flip-flop clock signal (S150).

When the clock signal is applied to the inverter chain 20, and an AND operation is performed on output signals of at least two respective domino logic stages among the domino logic stages 14-1 through 14-$n$, the signal generated as a result of the AND operation will have a first pulse width. However, when the flip-flop clock signal having a duty cycle of (e.g.) 50% of the clock signal is applied to the inverter chain 20 and an AND operation is performed on output signals of at least two respective domino logic stages among the domino logic stages 14-1 through 14-$n$, the signal generated as a result of the AND operation will be a second pulse width, narrower than the first pulse width.

As described above in accordance with certain embodiments of the inventive concept, a pseudo-static domino logic circuit may be implemented having a relatively smaller physical size than analogous conventional circuits. In addition, domino logic circuits according to embodiments of the inventive concept operate at high speed with relatively low power consumption.

While the inventive concept has been particularly shown and described with reference to exemplary embodiments thereof, it will be understood by those of ordinary skill in the art that various changes in forms and details may be made therein without departing from the scope of the inventive concept as defined by the following claims.

What is claimed is:

1. A domino logic circuit comprising:
   a plurality of domino logic stages connected in series between a latch and a flip-flop; and
   a clock signal generator that generates a clock signal having a first duty cycle and a flip-flop clock signal having a second duty cycle different from the first duty cycle,
   wherein the latch and each one of the plurality of domino logic stages respectively operates in response to one of a plurality of domino clock signals related to the clock signal, and the flip-flop operates in response to the flip-flop clock signal.

2. The domino logic circuit of claim 1, wherein the first duty cycle is greater than the second duty cycle.

3. The domino logic circuit of claim 1, further comprising:
   an inverter chain that receives the clock signal and includes a plurality of inverters connected in series such that the plurality of domino clock signals are alternatingly provided by the inverter chain as the clock signal and an inverted clock signal,
   wherein each one of the plurality of domino logic stages comprises a dynamic node including at least one transistor having a gate receiving one of the plurality of domino clock signals and being connected to a power supply node, and a logic network connected between the dynamic node and another power supply node, the logic network being configured to determine a logic level for the dynamic node in response to an output signal and at least one input data signal.

4. The domino logic circuit of claim 3, wherein the plurality of domino logic stages comprises a first odd domino logic stage, comprising:
   a first dynamic node including a PMOS transistor and a NMOS transistor having respective gates receiving the clock signal from the inverter chain and connected between a power supply node and ground; and
   a first logic network connected between the first dynamic node and ground, wherein the first logic network is configured to determine a logic level for the first dynamic node in response to an output signal received from the latch and an input data signal applied to the first domino logic stage.

5. The domino logic circuit of claim 4, wherein the plurality of domino logic stages further comprises alternating even and odd domino logic stages, and a final domino logic stage,
   wherein each even domino logic stage comprises a dynamic node including a NMOS transistor having a gate receiving the inverted clock signal from the inverter chain and a logic network connected between the dynamic node and the power supply node, wherein each logic network is respectively configured to determine a logic level for a corresponding dynamic node in response to an output signal received from a previous odd domino logic stage and an input data signal applied to the even domino logic stage; and
   each odd domino logic stage comprises a dynamic node including a PMOS transistor having a gate receiving the clock signal from the inverter chain and a logic network connected between the dynamic node and the ground, wherein each logic network is respectively configured to determine a logic level for a corresponding dynamic node in response to an output signal received from a previous even domino logic stage and an input data signal applied to the odd domino logic stage.

6. The domino logic circuit of claim 1, wherein when the clock signal has a first phase, a logic level of a first dynamic node of a first domino logic stage among the plurality of domino logic stages is determined in response to an output signal from the latch and at least one input data signal applied to a first network connected between the dynamic node and ground through an evaluation transistor; and
   wherein when the clock signal has the first phase, a logic level of each dynamic node of second through Nth domino logic stages in the plurality of domino logic stages is successively and respectively determined in response to at least one data signal and an output signal of a dynamic node of a previous logic stage respectively applied to transistors directly connected between the dynamic node and a power supply node.

7. The domino logic circuit of claim 6, further comprising:
   an inverter chain that receives the clock signal and includes a plurality of inverters connected in series such that the plurality of domino clock signals are alternatingly provided by the inverter chain as the clock signal and an inverted clock signal,
   wherein the dynamic node of the first domino logic stage is pre-charged in response to the clock signal, and
   the respective dynamic nodes of the second through Nth domino logic stages are successively pre-charged in response to a corresponding one of the plurality of domino clock signals.

8. The domino logic circuit of claim 1, wherein the clock signal generator comprises:

a plurality of series-connected inverters that receives a global clock signal;

a gate that performs a logical operation on the global clock signal and an output of the series-connected inverters to generate the clock signal; and a delay circuit that delays the global clock signal to generate the flip-flop clock signal.

9. A central processing unit (CPU) comprising:

an arithmetic logic unit (ALU) and a control unit that controls operation of the ALU, the ALU comprising:

a plurality of domino logic stages connected in series between a latch and a flip-flop, and a clock signal generator that generates a clock signal having a first duty cycle and a flip-flop clock signal having a second duty cycle different from the first duty cycle, wherein the latch and each one of the plurality of domino logic stages respectively operates in response to one of a plurality of domino clock signals related to the clock signal and the flip-flop operates in response to the flip-flop clock signal.

10. The CPU of claim 9, wherein the first duty cycle is greater than the second duty cycle.

11. The CPU of claim 9, wherein the clock signal is activated before the flip-flop clock signal is activated, and the clock signal is deactivated after the flip-flop clock signal is deactivated.

12. The CPU of claim 9, wherein the clock signal generator comprises:

a plurality of series-connected inverters that receives a global clock;

a gate configured to perform a logical operation on the global clock signal and an output signal of the series-connected inverters to generate the clock signal; and a delay circuit that delays the global clock signal to generate the flip-flop clock signal.

13. The CPU of claim 9, further comprising an inverter chain receives the clock signal and includes a plurality of inverters connected in series such that the plurality of domino clock signals are alternatingly provided by the inverter chain as the clock signal and an inverted clock signal, wherein each one of the plurality of domino logic stages comprises a dynamic node including at least one transistor having a gate receiving one of the plurality of domino clock signals and being connected to a power supply node, and a logic network connected between the dynamic node and another power supply node, the logic network being configured to determine a logic level for the dynamic node in response to an output signal and at least one input data signal.

14. A data processing apparatus comprising:

a memory and a central processing unit (CPU) that controls operation of the memory, wherein the CPU includes an arithmetic logic unit (ALU) and a control unit that controls operation of the ALU, the ALU comprising:

a plurality of domino logic stages connected in series between a latch and a flip-flop;

a clock signal generator that generates a clock signal having a first duty cycle and a flip-flop clock signal having a second duty cycle different from the first duty cycle, wherein the latch and each one of the plurality of domino logic stages respectively operates in response to one of a plurality of domino clock signals related to the clock signal and the flip-flop operates in response to the flip-flop clock signal.

15. The data processing apparatus of claim 14, wherein the first duty cycle is greater than the second duty cycle.

16. The data processing apparatus of claim 15, wherein the clock signal is activated before the flip-flop clock signal is activated, and the clock signal is deactivated after the flip-flop clock signal is deactivated.

17. The data processing apparatus of claim 14, wherein the clock signal generator comprises:

a plurality of series-connected inverters that receives a global clock signal;

a gate configured to perform a logical operation on the global clock signal and an output of the series-connected inverters to generate the clock signal; and a delay circuit that delays the global clock signal to generate the flip-flop clock signal.

18. The data processing apparatus of claim 14, wherein the data processing apparatus is one of a personal computer, a portable electronic device, and a data server.

19. A method of operating an integrated circuit including a plurality of domino logic stages connected in series between a latch and a flip-flop, the method comprising:

generating a clock signal having a first duty cycle and a flip-flop clock signal having a second duty cycle different from the first duty cycle;

generating a plurality of domino clock signals by passing the clock signal through an inverter chain that at each stage of the inverter chain provides either the clock signal or an inverted clock signal;

pre-charging each one of the plurality of domino logic stages in response to a corresponding one of the plurality of domino clock signals;

determining a logic level of a first domino logic stage among the plurality of domino logic stages in response to an output signal provide by the latch and a data signal applied to the first domino logic stage;

successively and respectively determining a logic level of a second through Nth domino logic stage among the plurality of domino logic stages in response to an output signal provide by a previous domino logic stage and a data signal respectively applied to the second through Nth domino logic stages; and latching a data signal of a last one of the plurality of domino logic stages in the flip-flop in response to the flip-flop clock signal.

20. The method of claim 19, wherein the first duty cycle is greater than the second duty cycle.

* * * * *